(12) United States Patent
Yokoi et al.

(10) Patent No.: US 6,495,922 B2
(45) Date of Patent: Dec. 17, 2002

(54) SEMICONDUCTOR DEVICE WITH POINTED BUMPS

(75) Inventors: Tetsuya Yokoi, Tokyo (JP); Morihiko Ikemizu, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/803,947

(22) Filed: Mar. 13, 2001

(65) Prior Publication Data

US 2002/0011677 A1 Jan. 31, 2002

(30) Foreign Application Priority Data

Mar. 14, 2000 (JP) .......................................... 2000-070211

(51) Int. Cl.[7] ............................................. H01L 29/40
(52) U.S. Cl. ........................ 257/778; 257/737; 257/701
(58) Field of Search ................................. 257/701, 778, 257/774, 700, 737

(56) References Cited

U.S. PATENT DOCUMENTS

| | | | | |
|---|---|---|---|---|
| 5,905,303 A | * | 5/1999 | Kata et al. | 257/701 |
| 6,096,577 A | * | 8/2000 | Hashimoto | 438/116 |
| 6,194,781 B1 | * | 2/2001 | Ikegami | 257/737 |

FOREIGN PATENT DOCUMENTS

JP          9-172021          6/1997

* cited by examiner

*Primary Examiner*—Roy Potter
(74) *Attorney, Agent, or Firm*—Finnegan, Henderson, Farabow, Garrett & Dunner, L.L.P.

(57) ABSTRACT

Bumps each having a pointed tip end or grooves are formed on electrodes of a chip, and they pierce wiring layers of an insulating film substrate such as an interposer so as to tear an oxide film or a contaminated layer produced on the surface of each of wiring layers. A new interface of the material is enabled to be continuously produced between the bumps and the wiring layers, thus making it possible to obtain an excellent electrical connection among them.

10 Claims, 12 Drawing Sheets

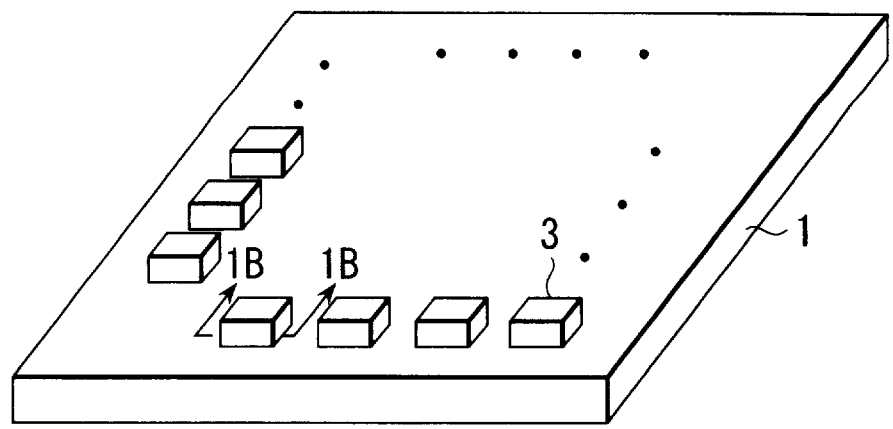
FIG. 1A
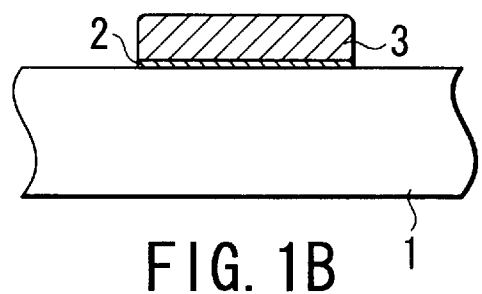
FIG. 1B
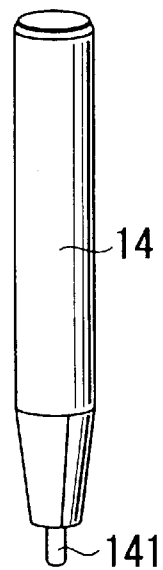 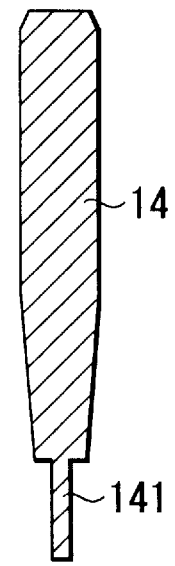
FIG. 2A  FIG. 2B

SEMICONDUCTOR DEVICE WITH POINTED BUMPS

CROSS-REFERENCE TO RELATED APPLICATIONS

This application is based upon and claims the benefit of priority from the prior Japanese Patent Application No. 2000-070211, filed Mar. 14, 2000, the entire contents of which are incorporated herein by reference.

BACKGROUND OF THE INVENTION

1. Field of the Invention

The present invention relates to a semiconductor device using a film type thin insulating substrate as an interposer, and in particular, to a semiconductor device which is adapted to be employed in a thin semiconductor package or in antenna circuit board of an RFID (Radio Frequency Identification) device.

A semiconductor device using a film type interposer according to the prior art includes generally a semiconductor element (hereinafter referred to as a chip) having a plurality of pads, protruded bumps bonded to the pads respectively, and an interposer composed of an insulating film substrate having wiring layers formed of a patterned metal foil, the wiring layers being electrically connected to the bumps.

There are known several kinds of film type interposers which are adapted to be employed in a semiconductor device. Generally, these film type interposers are called an FPC (Flexible Printed Circuit board) and provided in such a manner that a metal foil such as a copper or aluminum foil is adhered onto an insulating polyimide film or an insulating PET film and that the metal foil is etched to provide conductive circuits composed of a large number of conductive layers.

As for the method of bonding a chip to this film substrate, there is known a bonding method wherein a metallic bump is formed on each pad of the chip and then, the chip is bonded to the film substrate by using an ACF (anisotropic conductive film).

FIG. 16A shows a perspective view of a chip according to the prior art, and FIG. 16B shows a cross-sectional view taken along the line 16B–16B of FIG. 16A. Referring to FIGS. 16A and 16B, on a peripheral region of main surface of a chip 101 made of a silicon semiconductor, there are provided a plurality of pads 102 of aluminum, on each of which a plated bump 103 by gold plating is provided. As for the method of forming this bump 103, there is known a method wherein a conductive film called a barrier metal is formed on the main surface of the chip 101, a plating mask is formed using a photoresist, and bumps are selectively formed on the barrier metal by means of electroplating, unwanted portions of barrier metal layer being subsequently removed.

FIG. 17A shows a perspective view of another example of a chip according to the prior art, and FIG. 17B shows a cross-sectional view taken along the line 17B–17B of FIG. 17A. Referring to FIGS. 17A and 17B, on a peripheral region of a surface of a chip 101 made of a silicon semiconductor, there are formed a plurality of pads 102 of aluminum, on each of which a stud bump 104 is provided. The stud bump 104 is formed through the stud bonding of an Au wire, the top surface of the resultant stud being subsequently pressed. More specifically, the stud bump 104 is formed by a method wherein an electrode called a torch rod is placed near a tip of Au wire, and a high voltage is applied between the torch rod and the tip of Au wire to generate a spark discharge therebetween, thereby heating the tip of the Au wire so as to provide a ball which is then pressed to the pad 102 of the chip, using a bonding tool having a capillary, the remainder of the Au wire being then pulled up, and the top surface of the bump thus formed being subsequently pressed to provide the bump.

FIG. 18A shows a perspective view of a film substrate wherein an ACF is adhered onto an insulating film substrate having aluminum wiring layers, and FIG. 18B shows a cross-sectional view taken along the line 18B—18B of FIG. 18A. Referring to FIGS. 18A and 18B, on the surface of an insulating film substrate 105 of a polyimide film, there is formed an adhesive layer 108, on which aluminum wiring layers 106 are provided. Further, an ACF 107 is provided over the adhesive layer 108 to cover an end of each of the leads for providing the aluminum wiring layers 106.

FIG. 19A shows a perspective view of a device wherein a chip having bumps, which are attached to the chip by the method illustrated in FIGS. 16A and 16B, or in FIGS. 17A and 17B, is placed via an ACF onto an insulating film substrate, and then bonded to the insulating film substrate, thereby electrically connecting the bumps to the wiring layers of the insulating film substrate. FIG. 19B shows a cross-sectional view taken along the line 19B—19B of FIG. 19A. FIG. 20 is an enlarged cross-sectional view of FIG. 19B, illustrating the bonded portion between the chip and the insulating film substrate. Referring to FIGS. 19A, 19B and 20, in the same manner as the case of bonding of a flip chip, the chip 101 having the bumps 104 is aligned with the wiring layers 106 of the insulating film substrate 105, and bonded thereto under a heated condition so as to cure the resin of the ACF 107, thereby executing not only the bonding of the chip 101 but also the electrical connection between the bumps (stud bumps) 104 and the aluminum wiring layers 106. By the way, the electrical connection between the stud bumps 104 and the aluminum wiring layers 106 is carried out through metallic particles 109 dispersed in the ACF 107.

As described above, the electrical connection between the bumps formed on the pads of chip and the insulating film substrate is realized through the metallic particles 109 added to the ACF 107. For example, in the case of FC262B (ACF, a product from Hitachi Kasei Co., Ltd.), a resin containing a main component of the FC262B is cured at a temperature of 180° C. for about 30 seconds. Further, since a suitable amount of Ni particles having a particle size of about 5 to 20 $\mu$m is contained in the FC262B as the metallic particles, the electrical connection between the aluminum wiring layers of the insulating film substrate and the bumps of the chip can be provided. Additionally, since the chip and the insulating film substrate are bonded to each other by heating and pressing, the Ni particles are enabled to thrust into the aluminum wiring layers of the insulating film substrate, thereby breaking the oxide film formed on the surface of aluminum wiring layers and making it possible to provide the electric conduction between the bumps and the aluminum wiring layers. However, it has been found through a reliability test such as a temperature cycling test that an oxide film tends to be newly formed on a surface of an easily oxidizable aluminum layer, thereby giving rise to conduction failure. Further, there is also known a paste type anisotropic conductive resin other than the aforementioned film type anisotropic conductive resin. However, since this paste type anisotropic conductive resin also contains metallic particles, problems such as the sedimentation of metallic particles would be caused to occur, thus deteriorating the yield in the electrical connection between the bumps and the aluminum wiring layers.

Next, other problems accompanied with the conventional interposer will be explained with reference to FIGS. 21 to 23.

FIG. 21 illustrates a perspective view of a conventional insulating film substrate having aluminum wiring layers on both surfaces, to which a chip is connected in the same manner as the bonding of the flip chip. FIG. 22 illustrates a cross-sectional view of an insulating film substrate having through-holes, wherein aluminum wiring layers provided on both surfaces of the substrate are connected to each other through the plated through-hole. FIG. 23 illustrates a cross-sectional view of an insulating film substrate having wiring layers on both surfaces, wherein the aluminum wiring layers are connected to each other by mechanical caulking. FIG. 21 shows a perspective view an opposite surface of an insulating film substrate 105 having wiring layers on both sides. Namely, aluminum wiring layers of the main surface of the film substrate 105, on which a chip is mounted, are partially connected to those of the opposite side through a caulking member 111. In FIG. 22, a through-hole is formed in the insulating film substrate 105 so that it penetrates through copper wiring layers 112 provided on both surfaces of the insulating film substrate 105, and plating is applied to the inner surface of the through-hole to form a plated layer 113, thereby electrically connecting both-sided copper wiring layers 112 to one another. In this case, since a plating process is required, the manufacturing cost would be greatly increased. Further, aluminum wiring layers can not be used because they are not adapted to plating. In the case of the method shown in FIG. 23, since the mechanical caulking is employed, it becomes possible to use the aluminum wiring layers 106. However, in order to perform the mechanical caulking, an area of at least 2 mm or more is required, thereby limiting the processing. welding (spot welding) may be employed in the same manner as aforementioned caulking. However, since the welding also requires an area of at least 2 mm or more, the same problem as that of the aforementioned caulking will be raised.

BRIEF SUMMARY OF THE INVENTION

The present invention has been accomplished to overcome the aforementioned problems, and therefore, an object of the present invention is to provide a semiconductor device, wherein bumps each provided on an electrode of a chip are contacted to wiring layers of an insulating film substrate serving as an interposer to obtain excellent electrical connection, and wherein bumps each provided on a pad of a chip are made to pierce both-sided wiring layers or three or more wiring layers provided on an insulating film substrate, thereby accomplishing electrical connections among wiring layers.

Another object of the present invention is to provide a method of producing such a semiconductor device as mentioned above.

According to one aspect of the present invention, there is provided a semiconductor device wherein bumps, each provided on an electrode of a chip and having a sharply pointed configuration or cut grooves, are connected to wiring layers of an insulating film substrate used as an interposer while breaking an oxide film or contaminations formed on a surface of each of the wiring layers. Therefore, highly reliable electrical connection can be provided because a new phase of the material appears. Further, electrical connections among wiring layers can be obtained when the bumps pierce both-sided wiring layers, or three or more wiring layers of the film substrate.

According to another aspect of the present invention, there is provided a method of making a semiconductor device which comprises the steps of: forming a plurality of projected bumps on the pads formed on a surface of a semiconductor chip; preparing an interposer composed of an insulating film substrate having wiring layers formed by patterning of a metal foil; and bonding the bumps to the wiring layers in the form of a flip chip, thereby deforming a tip of each of bumps. The bumps may be composed of gold, and the wiring layers may be composed of aluminum. Another wiring layers may be formed on the opposite surface of the insulating film substrate, and the tip of each bump may be pierced through the insulating film substrate so that the bumps are electrically connected to the wiring layers of the opposite surface of the film substrate.

The tip of each of the bumps may be extended into the interior of the leads of the wiring layers. The bumps may be respectively formed of a stud bump or a plated bump. The tip of each of the bumps may be protruded to the opposite surface of the insulating film substrate. The tip of each of the bumps protruded from the opposite surface of the insulating film substrate may be electrically connected to the wiring layers of the insulating film substrate. The bumps may be composed of a material selected from gold, solder, copper and aluminum. The wiring layers formed on the insulating film substrate may be formed of a material selected from aluminum, copper, gold, silver and a conductive paste. The wiring layers to be formed on the surface of the insulating film substrate may be formed of an aluminum layer, while the bumps may be formed of gold. Furthermore, an adhesive or a thermosetting resin such as an under-fill resin may be interposed between the semiconductor chip and the insulating film substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a perspective view of a chip having Au bumps formed by plating according to one embodiment of the present invention;

FIG. 1B is a cross-sectional view taken along the line 1B—1B of FIG. 1A;

FIG. 2A is a perspective view of a metal tool for providing Au bumps employed in the embodiment;

FIG. 2B is a longitudinal cross-sectional view of the tool shown in FIG. 2A;

DETAILED DESCRIPTION OF THE INVENTION

A first embodiment of the present invention will be explained with reference to FIGS. 1A through 10B.

First of all, a method of forming bumps each having a recessed portion will be explained with reference to FIGS. 1A through 3B.

FIG. 1A shows Au bumps produced by plating. A plurality of pads 2 of aluminum are deposited at a peripheral region of a surface of a semiconductor chip 1, on which plated bumps 3 are formed by gold plating, respectively. For making the plated bumps 3, a barrier metal layer is formed on each of the pads. Thereafter, a plating mask is formed on the chip surface, using a photoresist, and bumps are selectively provided on the barrier metal layers through the plating mask by means of electroplating.

As explained hereinafter, when the bumps 3 of the chip 1 are bonded to aluminum wiring layers of an insulating film substrate, a recessed portion, slits, grooves, etc will be provided at each of bumps, or a pointed tip will also be provided on each of bumps in order to obtain excellent electrical connections by deformation of the bumps 3.

Figure 3A:
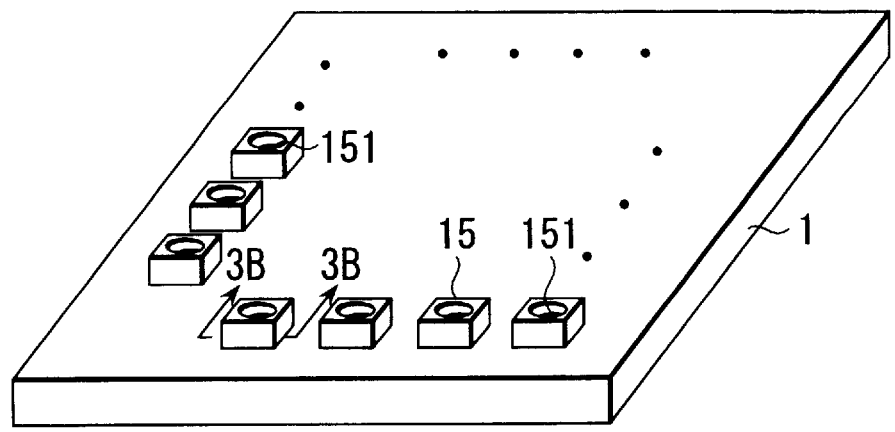
FIG. 3A is a perspective view of a chip having Au bumps each having a recessed portion according to the embodiment of the present invention.
Figure 3B:
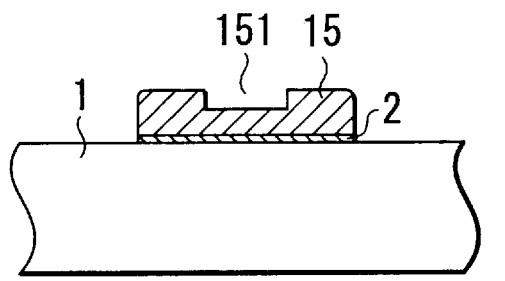
FIG. 3B is a cross-sectional view taken along the line 3B—3B of FIG. 3A.

Using a metal tool 14 of tungsten carbide having a tip 141 with a circular shape in cross section or a square shape in cross section as shown in FIGS. 2A and 2B, the tip 141 is pressed or impinged against the plated bumps 3 shown in FIG. 1A to form a recessed portion 151 in each bump 15 provided on the pads 2 as shown in FIGS. 3A and 3B.

Figure 4A:
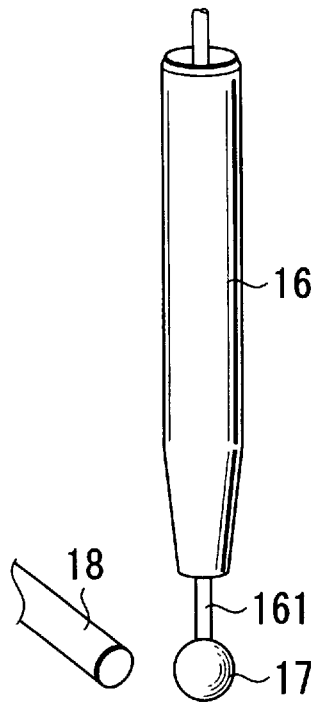
FIGS. 4A through 4D are cross-sectional views showing a method of forming a stud bump on a surface of a chip, using a bonding wire according to the embodiment of the present invention.
Figure 4B:
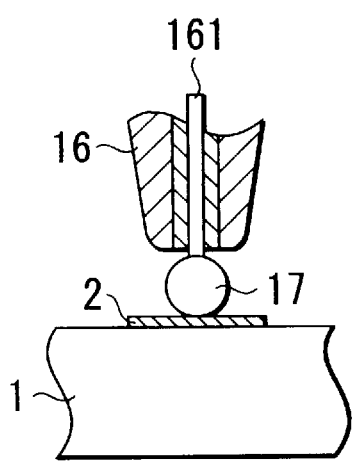
Figure 4C:
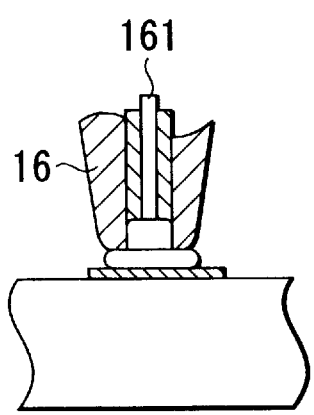
Figure 4D:
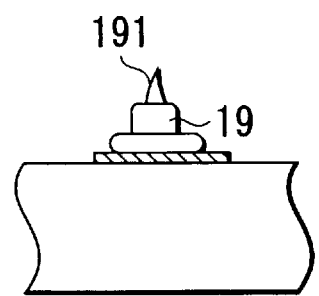

On the other hand, using a tool shown in FIG. 4A, a stud bump is formed by a process shown in FIGS. 4B to 4D. Namely, a torch rod 18 is placed close to a tip of an Au wire 161, between which a high voltage is applied to generate a spark discharge therebetween, thereby providing a ball 17 at the tip of Au wire 161 by heat. The ball 17 is then pressed on the pad 2 of the chip 1 by using a bonding tool (capillary) 16, the Au wire 161 being pulled up thereby to provide the stud bump 19. Since the Au wire 161 is torn away from the bump 19, the tip 191 of the bump 19 will have a pointed configuration, that is a stud.

Figure 5:
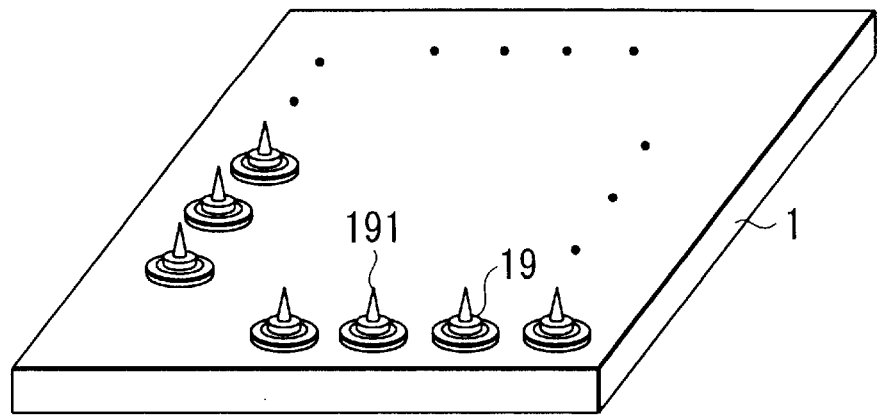
FIG. 5 is a perspective view showing a chip having stud bumps according to the embodiment of the present invention.

FIG. 5 shows a perspective view of the chip 1 having stud bumps 19. A plurality of pads 2 of aluminum are deposited on a peripheral region of a surface of a semiconductor chip 1, on which the stud bumps 19 are provided, respectively.

Next, a method of mounting a semiconductor chip on an insulating film substrate having aluminum wiring layers will be explained below. The semiconductor chip shown in FIG. 3A can be bonded to the insulating film substrate while applying heat and pressure in the same manner as in the case of the flip chip.

Figure 6:
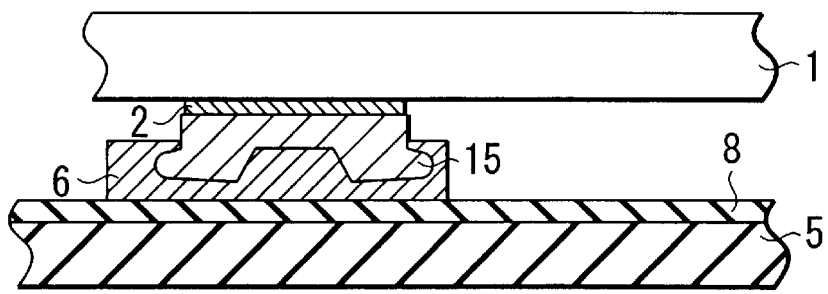
FIG. 6 is a cross-sectional view showing that a chip having Au bumps, formed as shown in FIG. 3A is bonded, is bonded to an insulating film substrate having aluminum wiring layers in the form of a flip chip.

FIG. 6 shows a cross-sectional view of an insulating film substrate 5 on which the chip 1 is mounted. The insulating film substrate 5 is coated with an adhesive 8 on which an aluminum wiring layer 6 is provided. That is, the chip 1 shown in FIG. 3A is mounted on the insulating film substrate 5 in such a manner that the Au bump 15 of the chip 1 are contacted with the aluminum wiring layer 6. Thereafter, heat and pressure are applied to the chip 1 and the insulating film substrate 5 to permit the bump 15 to cut into the aluminum wiring layer 6, thereby accomplishing the bonding. Thus, the tip of each of the bumps 15 is deformed and cuts into each of the aluminum wiring layers 6, thereby improving the mechanical bonding strength between the bumps 15 and the aluminum wiring layers 6.

In this case, the bumps 15 are contacted to the aluminum wiring layers 6 while tearing an oxide film produced thereon and making a new interface because the protruded portion of each of the bumps 15 is deformed and pressed. Furthermore, since the resultant contacting surface becomes a pure contact between Au and aluminum without using other kinds of materials such as the metallic particles in the conventional ACF, an Au-Al alloy can be produced by a subsequent heat treatment (for example, at 150° C., for 2 hours), thereby making it possible to realize electric contacts with high reliability.

Figure 7:
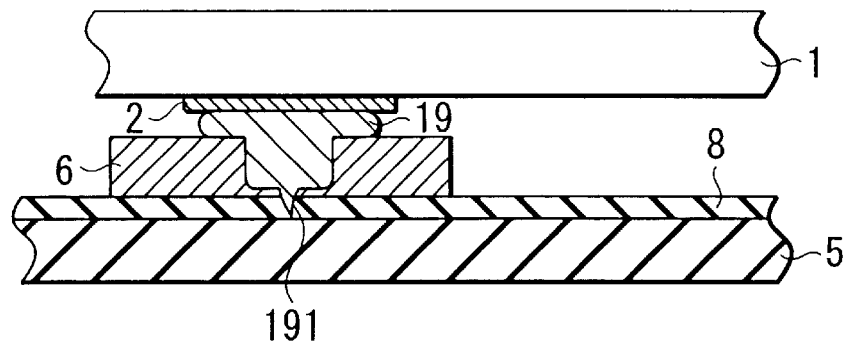
FIG. 7 is a cross-sectional view illustrating a state wherein a chip provided with stud bumps formed as shown in FIG. 4B is bonded, in the state of flip chip, to an insulating film substrate provided with an aluminum wiring layer.

FIG. 7 shows a cross-sectional view of an insulating film substrate on which a chip having stud bumps is mounted. Aluminum wiring layers 6 are provided on the insulating film substrate 5 via an adhesive 8. The chip 1 shown in FIG. 4B or FIG. 5 is mounted on the insulating film substrate 5 in such a manner that the Au bumps 19 of the chip 1 are contacted to the aluminum wiring layers 6. Thereafter, heat and pressure are applied to the chip 1 and the insulating film substrate 5 so that the aluminum wiring layers are pierced with the bumps 19. At this time, the tip of each of the Au bumps 19 is deformed and cuts into each of the aluminum wiring layers 6, thereby improving the mechanical bonding strength between the Au bumps 19 and the aluminum wiring layers 6.

Good electrical connections can be obtained by the methods described above. However, for the purpose of holding the chip to the insulating film substrate and more stably fixing the chip to the insulating film substrate, it can be possible that the insulating film substrate is coated with a thermosetting adhesive and that the thermosetting adhesive is cured by heating and pressing during bonding of the chip.

Figure 8A:
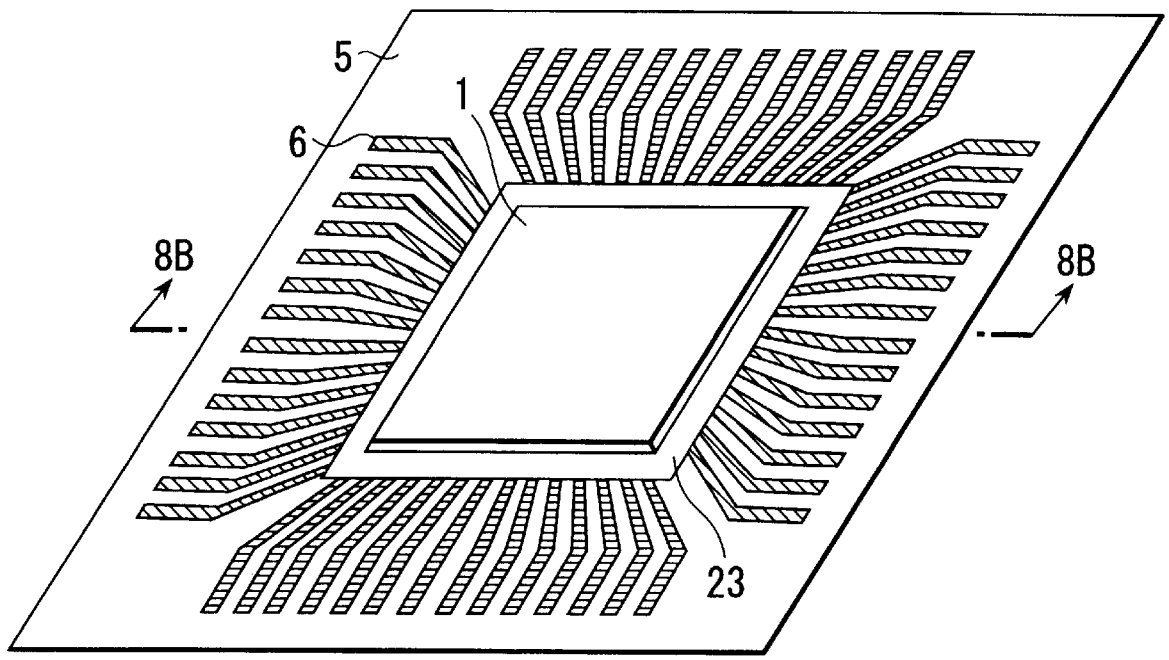
FIG. 8A is a perspective view showing that a chip is mounted on an insulating film substrate by an adhesive agent of a thermosetting resin in the form of flip chip bonding according to the embodiment of the present invention.
Figure 8B:
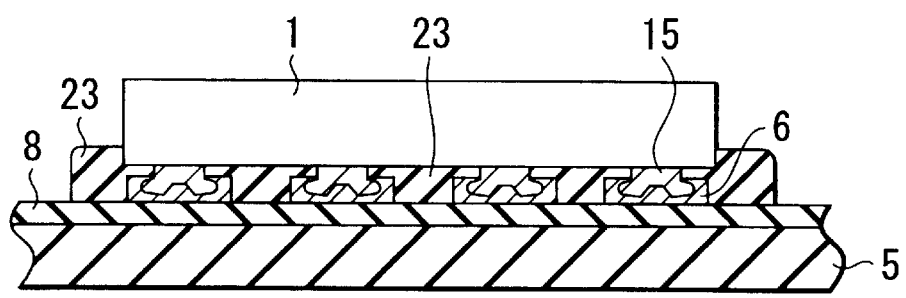
FIG. 8B is a cross-sectional view taken along the line 8B–8B of FIG. 8A.

FIGS. 8A and 8B illustrate such a state as described above. Namely, FIG. 8A shows a perspective view of the insulating film substrate on which the chip is mounted, and FIG. 8B shows a cross-sectional view taken along the line 8B—8B of FIG. 8A. As shown in FIGS. 8A and 8B, a thermosetting adhesive 23 is filled between the chip 1 and the adhesive layer 8 formed on the insulating film substrate 5, where the bonded portions between the aluminum wiring layers 6 and the bumps 15 are positioned.

The bumps 15 are intended to be contacted with the aluminum wiring layers in such a manner that they pierce the aluminum wiring layers. However, even if a wiring circuit is constituted by a relatively hard material such as a Cu wiring layer (including a Cu-plated layer), unwanted contaminations may be torn by the metal bumps described above, thereby obtaining a highly reliable electrical connection.

Next, surface configurations of bumps will be explained with reference to FIGS. 9A through 9C, and FIGS. 10A and 10B. By the way, with regard to FIGS. 9A through 9C, both perspective and cross-sectional views are shown respectively.

Figure 9A:
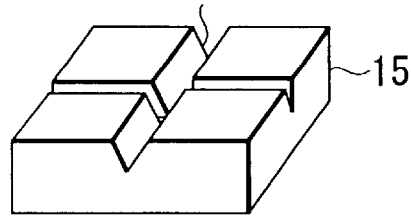
FIGS. 9A through 9C respectively are a perspective view and a corresponding cross-sectional view showing Au bumps having various configurations according to the embodiment of the present invention.
Figure 9B:
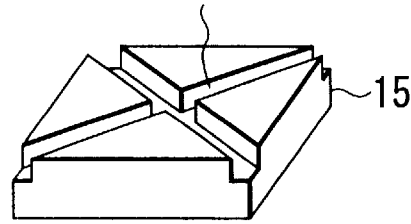
Figure 9C:
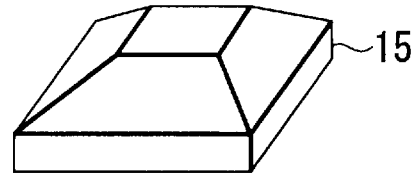

In FIG. 9A, a surface of a square bump 15 is provided with crossed grooves 152 having a V-shaped structure in cross section. In FIG. 9B on the other hand, the surface of the bump 15 is provided with crossed grooves 153 extending diagonally and having a U-shaped structure in cross section. Further, in FIG. 9C, all of the upper side edges of the bump 15 are chamfered or removed, thereby forming a smaller upper surface 154 than the opposite surface thereof.

Figure 10A:
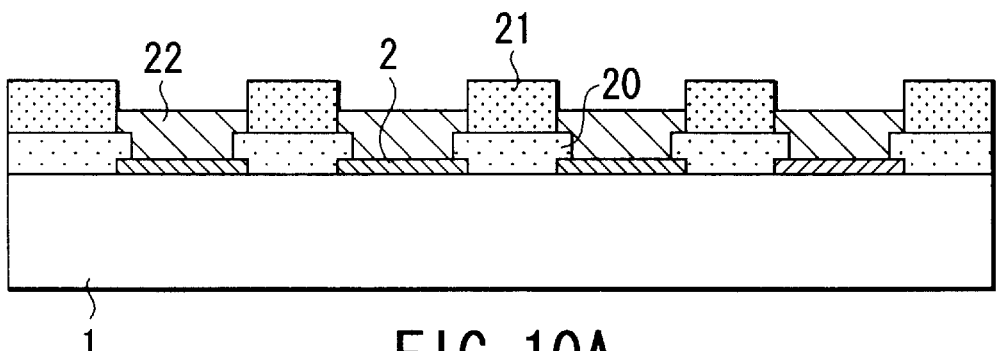
FIGS. 10A and 10B are cross-sectional views showing a method of forming plated bumps according to the embodiment of the present invention.
Figure 10B:
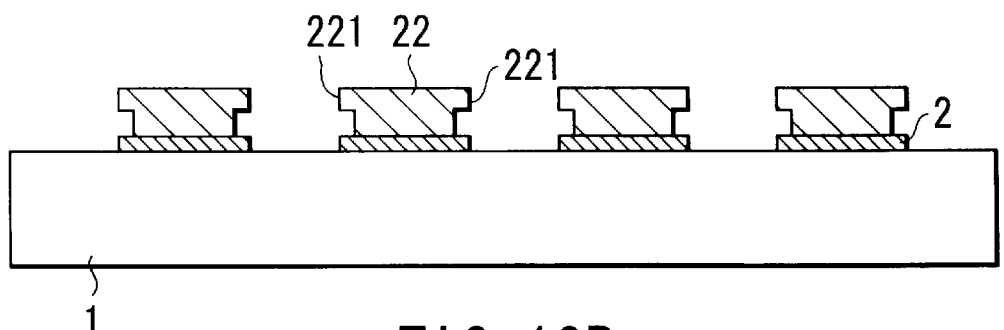

FIGS. 10A and 10B are cross-sectional views showing a method of forming bumps 22 each having an extended portion 221 which is externally extended from the periphery of the surface of the bump 22, the bumps 22 being formed by means of plating.

Referring to FIGS. 10A and 10B, a first photoresist 20 is formed on the chip 1 to expose the pads 2. Likewise, a second photoresist 21 is formed on the first photoresist 20 to expose the pads 2. In this case, the dimension of the opening of the second photoresist 21 is made larger than that of the opening of the first photoresist 20. After these photoresists processes, the chip 1 is subjected to plating. Thereafter, these first and second photoresists 20 and 21 are removed to obtain plated bumps 22 each having an extended portion 221 which is externally extended from the periphery of the surface of the plated bump 22.

Next, a second embodiment of the present invention will be explained with reference to FIGS. 11A, 11B, 12, 13, 14A, 14B, 15A and 15B.

Figure 11A:
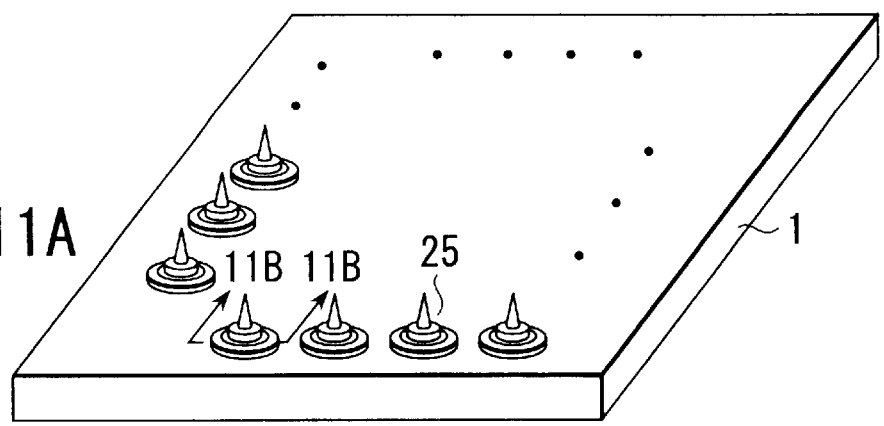
FIG. 11A is a perspective view of a chip having stud bumps according to another embodiment of the present invention.
Figure 11B:
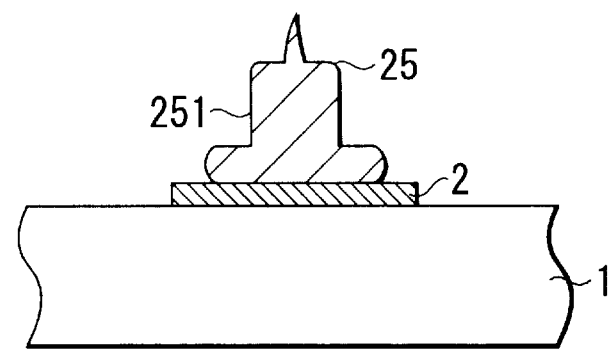
FIG. 11B is a cross-sectional view taken along the line 11B–11B of FIG. 11A.

As shown in FIGS. 11A and 11B, stud bumps 25 each having a long neck portion 251 are formed on the pads 2 of chip 1. Thus, the stud bumps 25 in this case are provided such that each of them has a pointed tip and a height of 50 to 100 μm so as to enable them to pierce the insulating film substrate. Even in the case of the plated bumps, it is possible to sharpen the tip of each of the plated bumps by the method illustrated in FIGS. 9A to 9C.

As shown in FIG. 11B, a plurality of pads 2 of aluminum are formed on a peripheral region of the surface of the chip 1, and stud bumps 25 each having a relatively long neck portion 251 as compared with that of the stud bumps 19 of FIG. 5 are formed on the pads 2, respectively.

Figure 12:
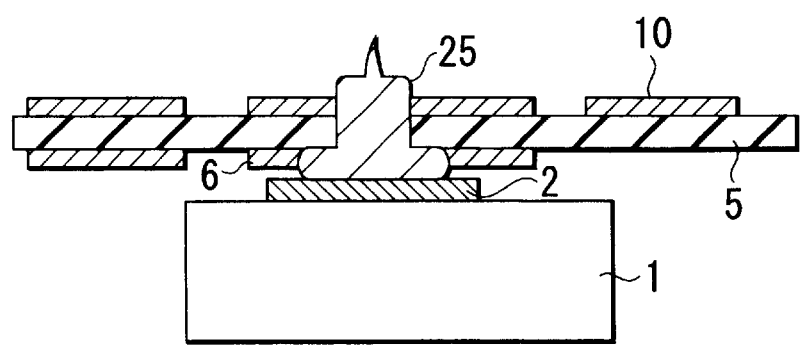
FIG. 12 is a cross-sectional view showing that a chip having stud bumps as shown in FIG. 11B is bonded in the form of a flip chip to an insulating film substrate having aluminum wiring layers.

As shown in FIG. 12, an insulating film substrate 5 to be electrically connected with the chip 1 has aluminum wiring layers 6 and 10 on both surfaces thereof, respectively. As for the insulating film substrate 5, a thin film substrate having a thickness of about 30 to 100 μm is used so that the stud bumps 25 pierce easily the insulating film substrate 5. As the base materials for the insulating film substrate 5, it is preferable to employ a soft material such as polyethylene, liquid crystal polymer, PET which can be thermally softened, and PVC. Thereafter, the chip is mounted on the insulating film substrate so as to enable the bumps to be contacted with the wiring layers, and then, heat and pressure are applied to both of the bumps and the wiring layers, thereby electrically connecting them with one another. As shown in the drawing, aluminum wiring layers 6 and 10 are provided on both surfaces of the insulating film substrate 5, respectively. Therefore, these aluminum wiring layers 6 and 10 can be electrically connected to one another through the stud bumps 25 that have pierced the insulating film substrate 5.

Figure 13:
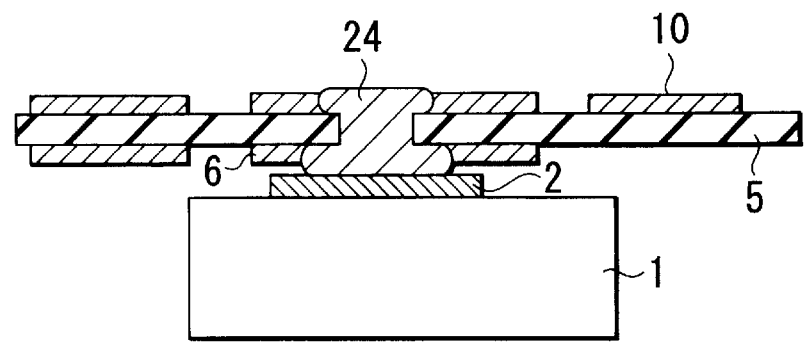
FIG. 13 is a cross-sectional view showing a pressed configuration of a stud bump piercing the insulating film substrate as shown in FIG. 12.

Further, as shown in FIG. 13, for the purpose of improving the connecting capability and reliability, it can be possible to collapse the tip of each stud bump 25 that has been protruded from each aluminum wiring layer 10 formed on the opposite surface of the insulating film substrate 5, thereby providing a flat bump 24.

FIGS. 14A, 14B, 15A and 15B show packages using both-sided connections described above. Namely, it becomes possible to produce a multi-chip package (MCP) by using the insulating film substrate having aluminum wiring layers on both surfaces thereof.

Figure 14A:
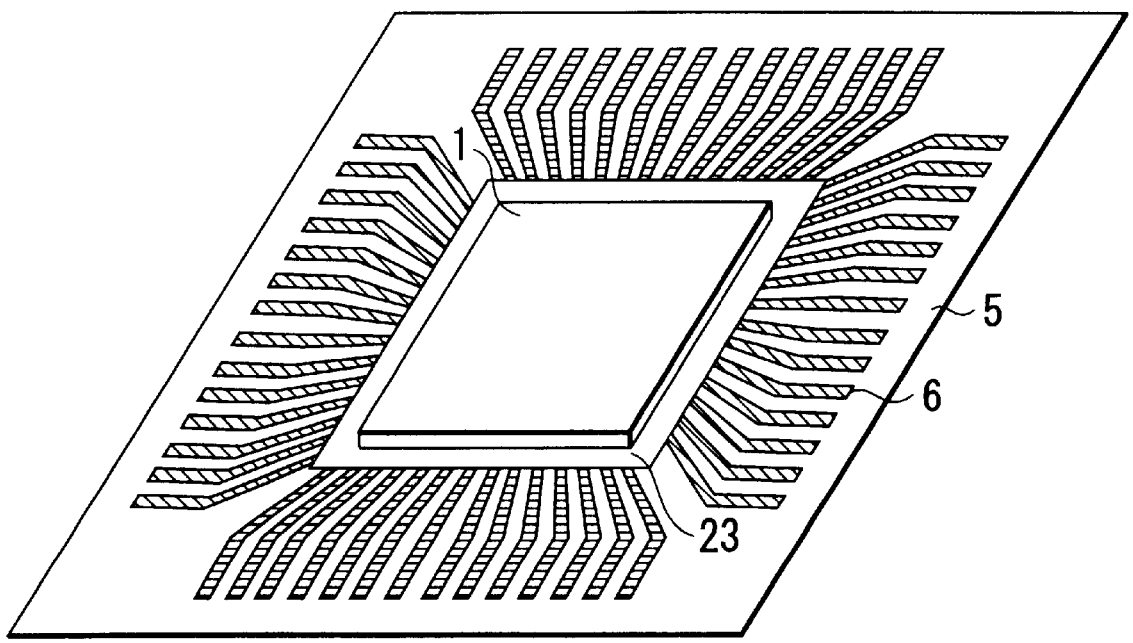
FIGS. 14A and 14B show perspective views illustrating a main and opposite surfaces of an insulating film substrate, respectively, where both-sided wiring layers are connected to one another according to the embodiment of the present invention.

As shown in FIG. 14A, aluminum wiring layers 6 are provided on the upper surface of the insulating film substrate 5. The bumps of the chip 1 are electrically connected to the aluminum wiring layers 6 of the insulating film substrate 5, and the chip 1 is fixed by an adhesive 23.

Figure 14B:
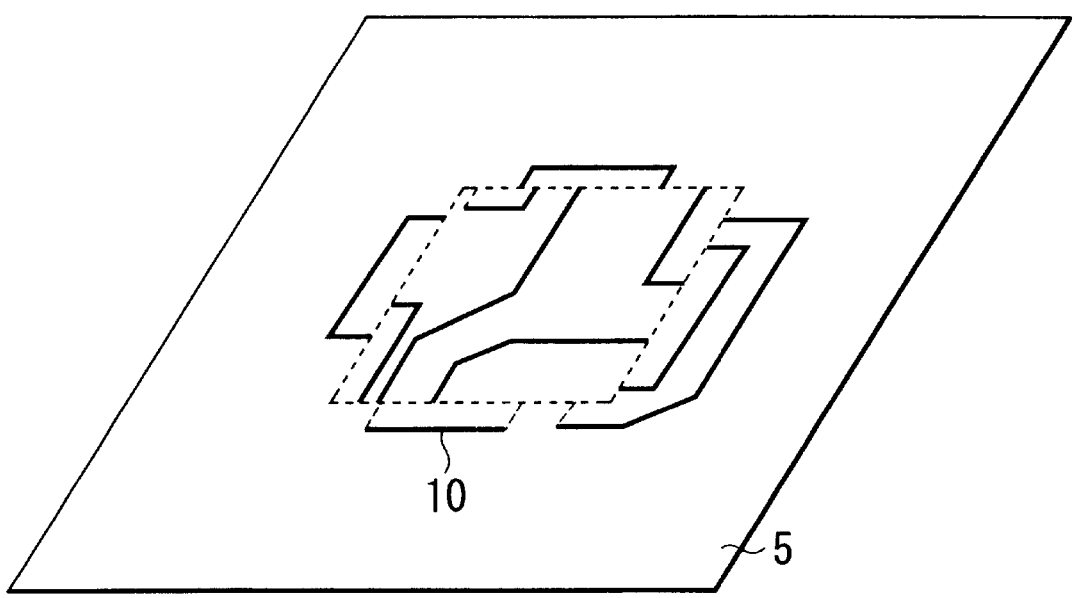

As shown in FIG. 14B, aluminum wiring layers 10 are provided on the opposite surface of the insulating film substrate 5, and these wiring layers 6 and 10 are electrically connected to one another by means of the bumps 25 as shown in FIG. 13.

Figure 15A:
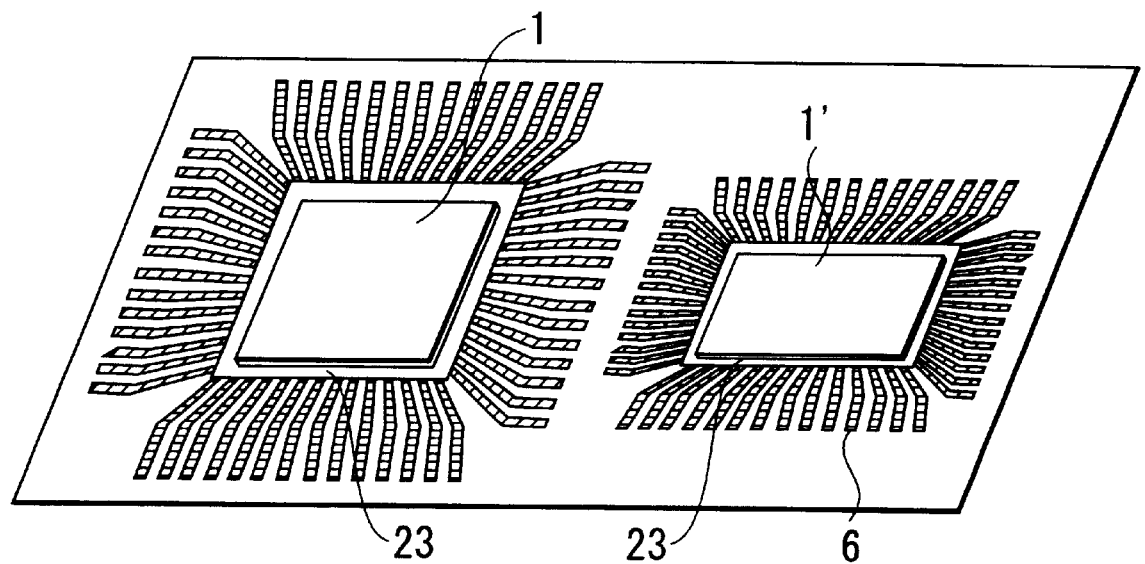
FIGS. 15A and 15B show perspective views illustrating a main and opposite surfaces of a multi-chip package in which two chips are mounted on an insulating film substrate according to the embodiment of the present invention.

As shown in FIG. 15A, two chips 1 and 1' are mounted on the upper surface of the insulating film substrate 5 having the aluminum wiring layers 6 thereon. The bumps of these chips 1 and 1' are electrically connected to the aluminum wiring layers 6 of the insulating film substrate 5, and these chips 1 and 1' are fixed by an adhesive 23.

Figure 15B:
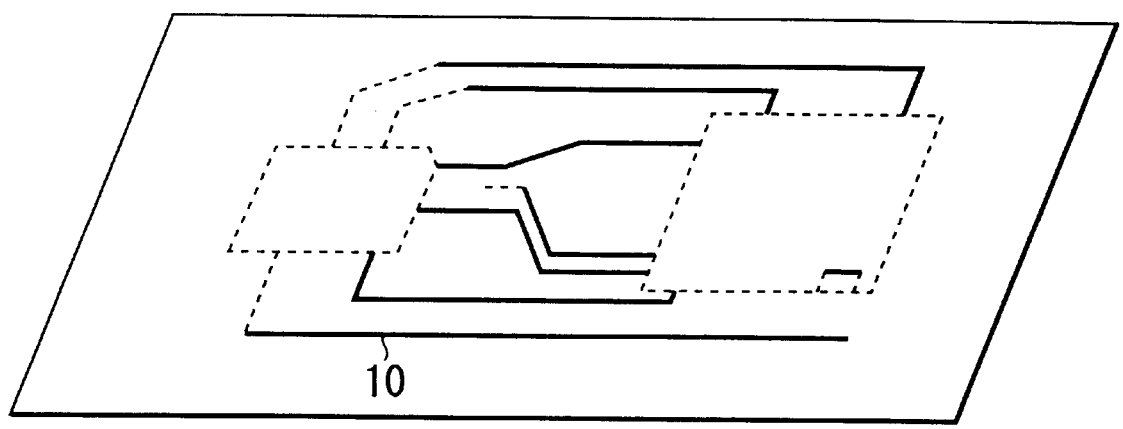
Figure 16A:
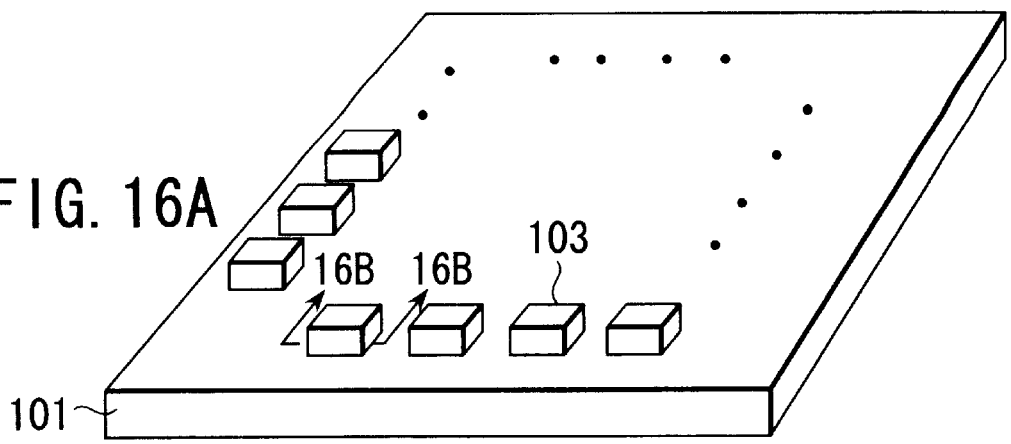
FIG. 16A is a perspective view of a chip according to the prior art.
Figure 16B:
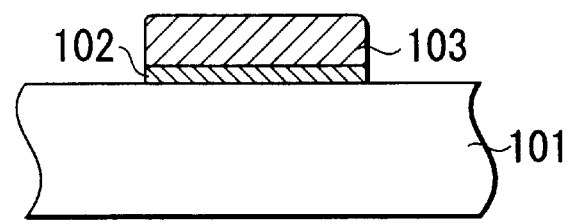
FIG. 16B is a cross-sectional view taken along the line 16B—16B of FIG. 16A.
Figure 17A:
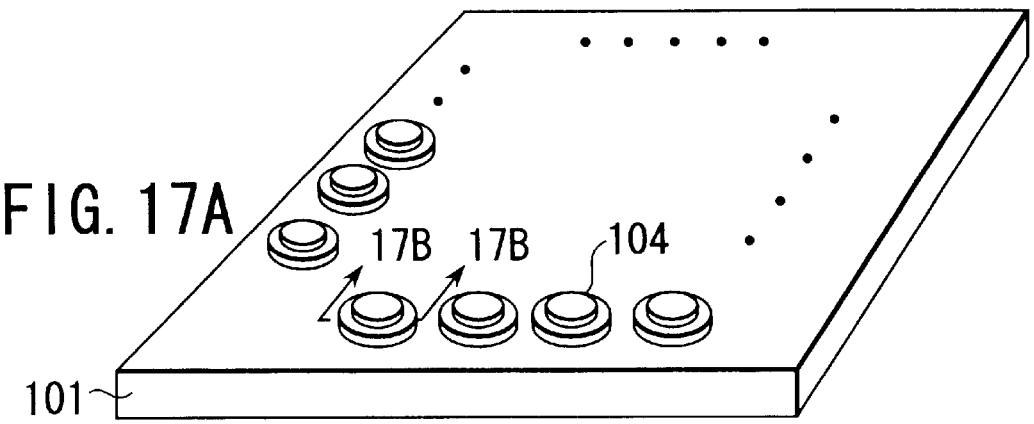
FIG. 17A is a perspective view of a chip according to the prior art.
Figure 17B:
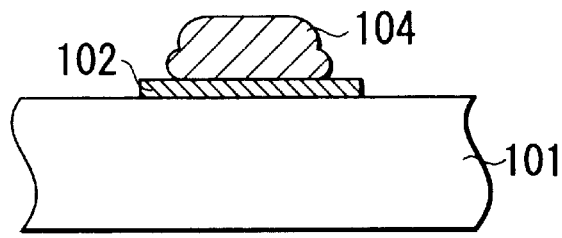
FIG. 17B is a cross-sectional view taken along the line 17B—17B of FIG. 17A.
Figure 18A:
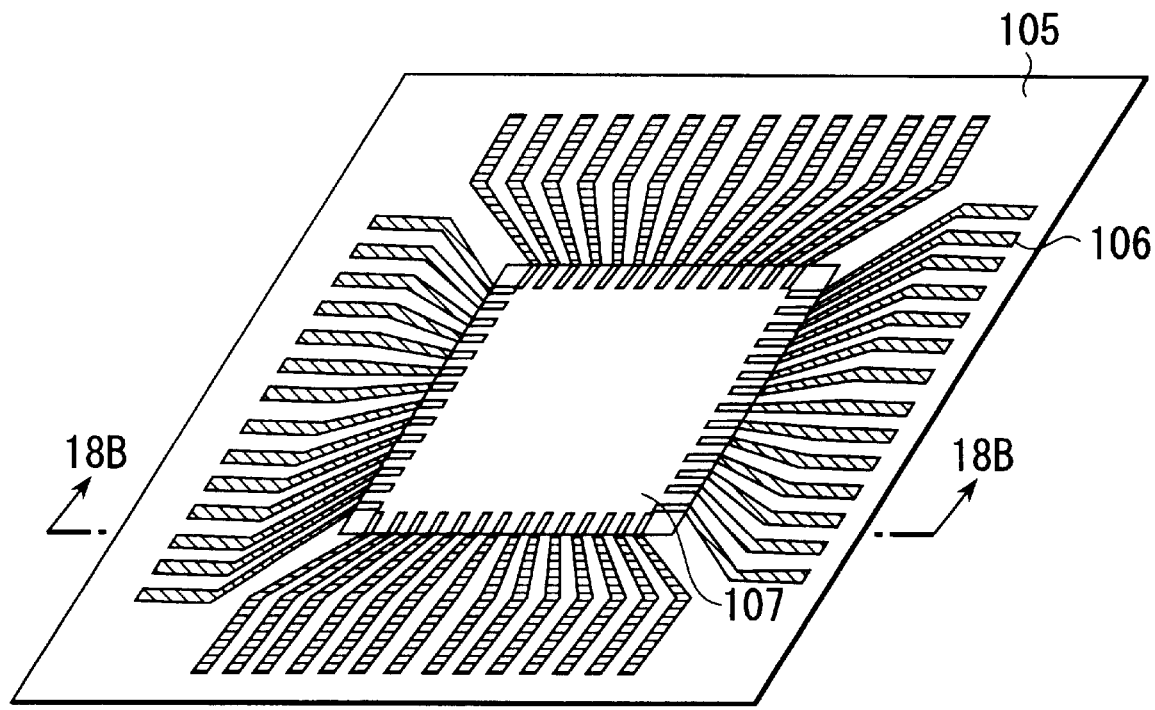
FIG. 18A is a perspective view of an insulating film substrate having aluminum wiring layers to which an ACF is adhered according to the prior art.
Figure 18B:
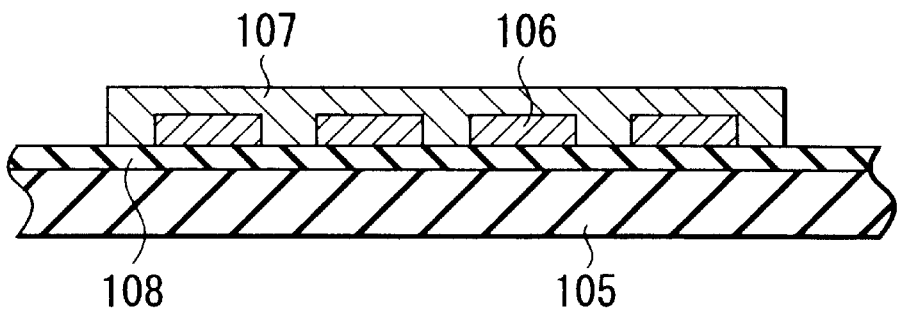
FIG. 18B is a cross-sectional view taken along the line 18B–18B of FIG. 18A.
Figure 19A:
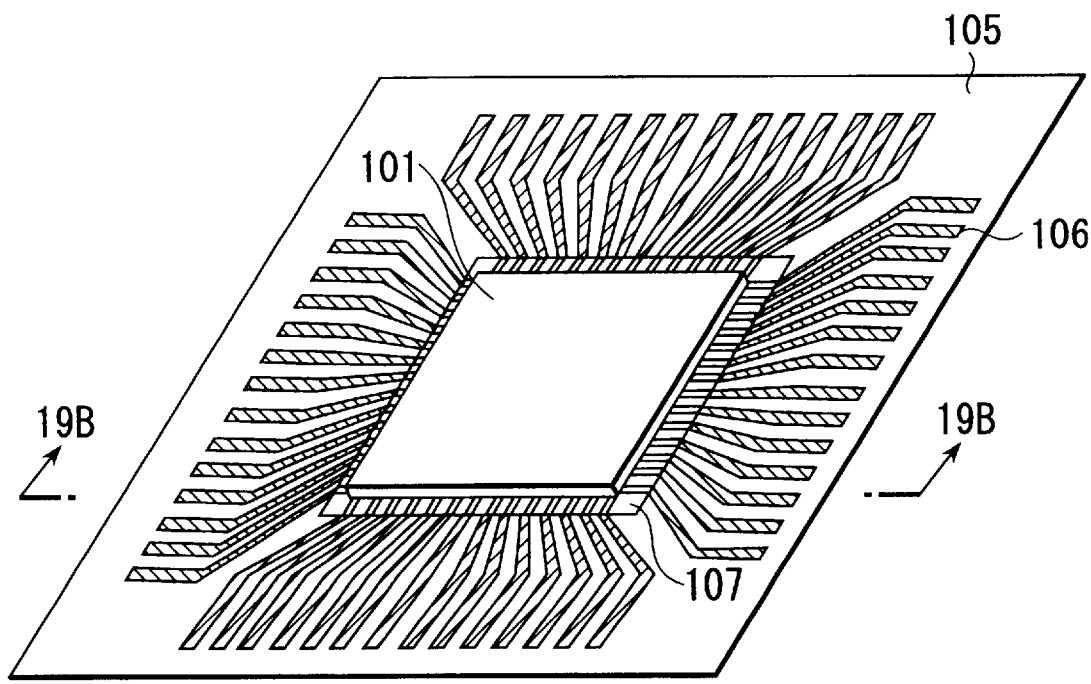
FIG. 19A is a perspective view of an insulating film substrate having wiring layers on which a chip is mounted through an AFC to bond bumps of the chip to the wiring layers.
Figure 19B:
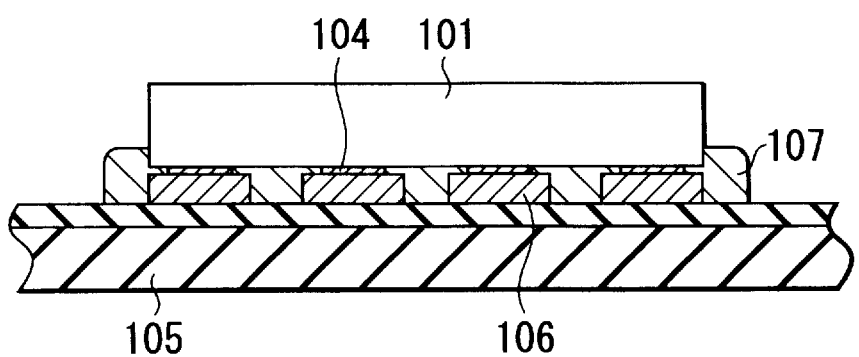
FIG. 19B is a cross-sectional view taken along the line 19B—19B of FIG. 19A.
Figure 20:
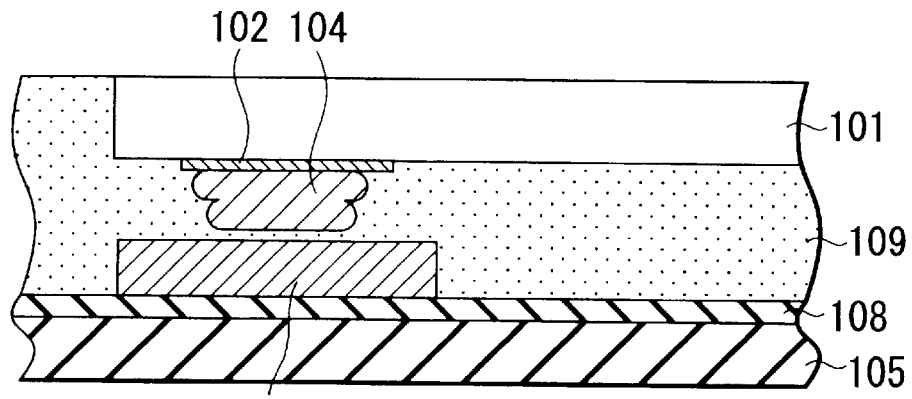
FIG. 20 is an enlarged cross-sectional view of the bonded portion shown in FIG. 19B.
Figure 21:
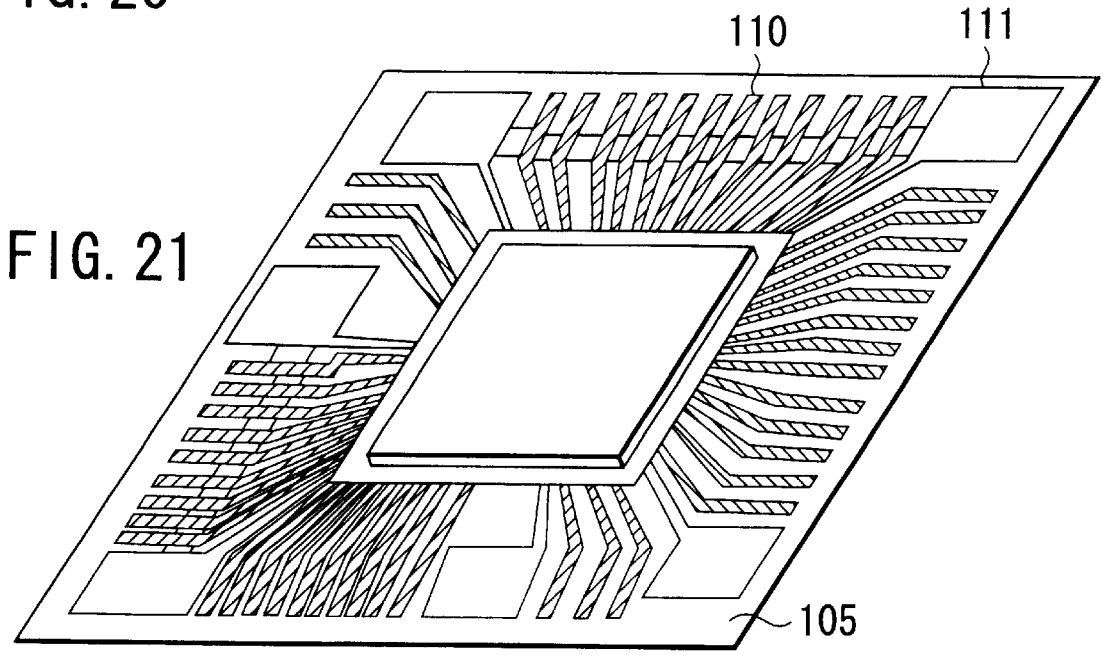
FIG. 21 is a perspective view of a conventional insulating film substrate having aluminum wiring layers on both surfaces on which a chip is mounted in the form of a flip chip.
Figure 22:
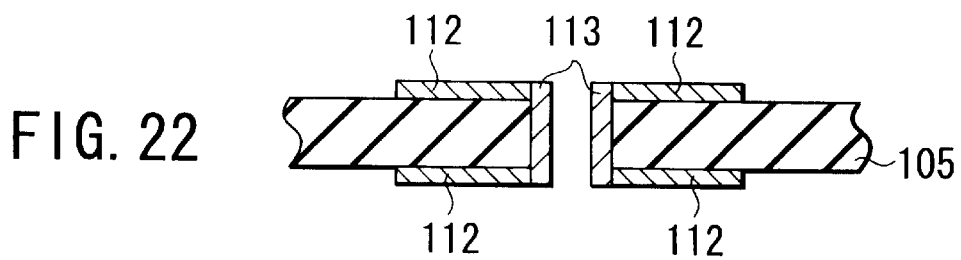
FIG. 22 is a cross-sectional view of an insulating film substrate whose wiring layers are connected to each other through a plated through-hole.
Figure 23:
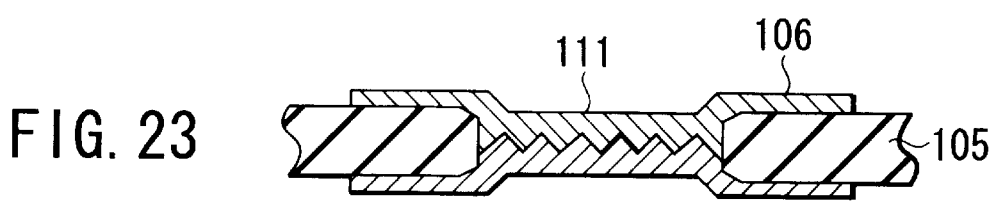
FIG. 23 is a cross-sectional view of an insulating film substrate whose wiring layers are connected with each other through a mechanical caulking.

As shown in FIG. 15B, aluminum wiring layers 10 are formed on the opposite surface of the insulating film substrate 5, and these wiring layers provided respectively on both surfaces are electrically connected to one another by means of the bumps 25 as shown in FIG. 13.

These packages can be applied to a thin semiconductor package or to the antenna circuit board of an RFID apparatus.

As explained above, according to the present invention, bumps have a pointed tip, grooves, slits, or an extended portion on the pads of the chip, and pierce the wiring layers of the insulating film substrate such as an interposer. Therefore, an oxide film or a contaminated layer which may be produced on the surface of the wiring layers can be continuously torn, thereby enabling a new interface to be continuously produced between the bumps and the wiring layers by the deformation of bumps. The mechanical strength among the bumps and the wiring layers together with an excellent electrical connection thereamong. Additionally, since the bumps pierce both-sided wiring layers or three or more wiring layers, the electrical connection among them can be accomplished.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a semiconductor chip having a plurality of pads on a surface thereof;
   a plurality of bumps each bonded to each of said pads;
   an interposer comprised of an insulating film having wiring layers thereon; and
   each of said bumps being provided with a neck having a pointed end, and being bonded to each of said wiring layers in the form of a flip-chip,
   wherein said pointed end cuts into each of said wiring layers.

2. A semiconductor device, comprising:
   a semiconductor chip having a plurality of pads on a surface thereof;
   a plurality of bumps each bonded to each of said pads;
   an interposer comprised of an insulating film having wiring layers thereon; and
   each of said bumps being provided with a neck having a pointed end, and being bonded to each of said wiring layers in the form of a flip-chip,
   wherein said pointed end cuts into each of said wiring layers and pierces said insulating film to reach an opposite surface thereof.

3. The semiconductor device according to claim 2, wherein said pointed end piercing said insulating film is electrically connected to a wiring layer provided on said opposite surface.

4. A semiconductor device, comprising:
   a semiconductor chip having a plurality of pads on a surface thereof;
   a plurality of bumps each bonded to each of said pads;
   an interposer comprised of an insulating film having wiring layers thereon; and
   each of said bumps being bonded to each of said wiring layers in the form of a flip-chip,
   wherein each of said bumps has an extended portion outwardly extending at a periphery of a surface portion thereof, and cuts into each of said wiring layers.

5. A semiconductor device comprising:
   a semiconductor chip having a plurality of pads on a surface thereof;
   a plurality of bumps each bonded to each of said pads;
   an interposer comprised of an insulating film having wiring layers thereon; and
   each of said bumps being bonded to each of said wiring layers in the form of a flip-chip,
   wherein a recessed portion is provided in each of said bumps.

6. The semiconductor device according to claim 5, wherein each of said bumps cuts into each of said wiring layers.

7. A semiconductor device comprising:
   a semiconductor chip having a plurality of pads on a surface thereof;
   a plurality of bumps each bonded to each of said pads;
   an interposer comprised of an insulating film having wiring layers thereon; and
   each of said bumps being bonded to each of said wiring layers in the form of a flip-chip,
   wherein crossed grooves are provided in each of said bumps.

8. The semiconductor device according to claim 7, wherein each of said crossed grooves has a V-shaped cross section.

9. The semiconductor device according to claim 7, wherein each of said crossed grooves has a U-shaped cross section.

10. The semiconductor device according to claim 7, wherein each of said crossed grooves cuts into each of said wiring layers.

* * * * *